United States Patent
Kim et al.

(10) Patent No.: US 10,522,364 B2
(45) Date of Patent: Dec. 31, 2019

(54) METHOD OF MANUFACTURING SEMICONDUCTOR DEVICE AND SEMICONDUCTOR DEVICE BY THE SAME

(71) Applicant: Samsung Electronics Co., Ltd., Suwon-si, Gyeonggi-do (KR)

(72) Inventors: Sung Min Kim, Hwaseong-si (KR); Dong Won Kim, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/051,683

(22) Filed: Aug. 1, 2018

(65) Prior Publication Data

US 2019/0221439 A1    Jul. 18, 2019

(30) Foreign Application Priority Data

Jan. 17, 2018    (KR) .................. 10-2018-0005838

(51) Int. Cl.

| | |
|---|---|
| *H01L 21/308* | (2006.01) |
| *H01L 21/8234* | (2006.01) |
| *H01L 29/66* | (2006.01) |
| *H01L 29/78* | (2006.01) |
| *H01L 27/088* | (2006.01) |

(52) U.S. Cl.
CPC .. *H01L 21/3086* (2013.01); *H01L 21/823431* (2013.01); *H01L 21/823481* (2013.01); *H01L 27/0886* (2013.01); *H01L 29/6656* (2013.01); *H01L 29/6681* (2013.01); *H01L 29/66545* (2013.01); *H01L 29/7851* (2013.01)

(58) Field of Classification Search
CPC ......... H01L 21/823431; H01L 29/6681; H01L 21/3086; H01L 21/0276; H01L 27/0207; H01L 21/76224; H01L 21/823481
See application file for complete search history.

(56) References Cited

U.S. PATENT DOCUMENTS

| | | |
|---|---|---|
| 8,987,836 B2 | 3/2015 | Kim et al. |
| 9,209,178 B2 | 12/2015 | Kanakasabapathy et al. |
| 9,437,713 B2 | 9/2016 | Singh et al. |
| 9,455,198 B1 | 9/2016 | Yu et al. |
| 9,607,985 B1 | 3/2017 | Tseng et al. |
| 9,673,202 B2 | 6/2017 | Liaw |
| 9,673,328 B2 | 6/2017 | Yu et al. |

(Continued)

*Primary Examiner* — Dung A. Le (74) *Attorney, Agent, or Firm* — Lee & Morse, P.C.

(57) ABSTRACT

A method including forming hard mask patterns on a substrate; forming etch stop patterns surrounding the hard mask patterns; forming spacer patterns covering sidewalls of the etch stop patterns; removing the etch stop patterns; etching the substrate to form active and dummy fins; forming a block mask pattern layer surrounding the active and dummy fins and forming mask etch patterns on a top surface of the block mask pattern layer; etching the block mask pattern layer to form block mask patterns surrounding the active fins; etching the dummy fins; removing the block mask patterns surrounding the active fins; and depositing a device isolation film on the substrate such that the device isolation film is not in contact with the upper portions of the active fins, wherein a spacing distance between the active fin and the dummy fin is greater than an active fin spacing distance between the active fins.

19 Claims, 5 Drawing Sheets

(56) References Cited

U.S. PATENT DOCUMENTS

| | | | |
|---|---|---|---|
| 9,679,994 B1 | 6/2017 | Chou et al. | |
| 9,704,737 B2 | 7/2017 | Feng et al. | |
| 9,704,751 B1 | 7/2017 | Chang et al. | |
| 2015/0147874 A1* | 5/2015 | Huang | H01L 21/823431 438/514 |
| 2016/0020109 A1* | 1/2016 | Yoo | H01L 21/3085 438/275 |
| 2016/0225633 A1 | 8/2016 | Kim et al. | |
| 2016/0307803 A1 | 10/2016 | Mun et al. | |
| 2017/0148643 A1* | 5/2017 | Ham | H01L 21/3086 |
| 2017/0256417 A1 | 9/2017 | Chou | |
| 2019/0103318 A1* | 4/2019 | Wang | H01L 21/823431 |

* cited by examiner

METHOD OF MANUFACTURING SEMICONDUCTOR DEVICE AND SEMICONDUCTOR DEVICE BY THE SAME

CROSS-REFERENCE TO RELATED APPLICATION

Korean Patent Application No. 10-2018-0005838, filed on Jan. 17, 2018, in the Korean Intellectual Property Office (KIPO), and entitled: "Method of Manufacturing Semiconductor Device and Semiconductor Device by the Same," is incorporated by reference herein in its entirety.

BACKGROUND

1. Field

Embodiments relate to a method of manufacturing a semiconductor device and a semiconductor device manufactured using the method.

2. Discussion of the Related Art

As increasing integration density of semiconductor devices is continuously required, design rules for components are being reduced.

SUMMARY

The embodiments may be realized by providing a method of manufacturing a semiconductor device, the method including forming hard mask patterns on a substrate such that forming the hard mask pattern includes forming a plurality of hard mask units, each hard mask unit having at least two hard mask patterns that are spaced a pattern spacing distance from each other and the hard mask units being separated from each other by a spacing distance that is greater than the pattern spacing distance; forming etch stop patterns surrounding the hard mask patterns of the hard mask units; forming spacer patterns covering sidewalls of the etch stop patterns; removing the etch stop patterns; etching the substrate using the hard mask patterns and the spacer pattern as etch masks to form at least one active fin unit that includes at least two active fins and to form dummy fins disposed on both sides of the at least one active fin unit; forming a block mask pattern layer surrounding the active fins and the dummy fins and forming mask etch patterns in regions including upper portions of the active fins on a top surface of the block mask pattern layer; etching the block mask pattern layer using the mask etch patterns to form block mask patterns surrounding the active fins; etching the dummy fins using the block mask patterns; removing the block mask patterns surrounding the active fins; and depositing a device isolation film on the substrate such that the device isolation film is not in contact with the upper portions of the active fins, wherein a spacing distance between one active fin and an adjacent dummy fin is greater than an active fin spacing distance between adjacent active fins.

The embodiments may be realized by providing a method of manufacturing a semiconductor device, the method including forming a plurality of hard mask units on a substrate such that each of the hard mask units includes at least two hard mask patterns spaced a pattern spacing distance from each other on an upper portion of the substrate; forming a plurality of spacer patterns on the substrate such that the spacer patterns are outside the hard mask units; and forming an active fin and dummy fin by etching the substrate using the hard mask patterns and the spacer patterns as etch masks, wherein a spacing distance between the active fin and an adjacent dummy fin is greater than an spacing distance between adjacent active fins.

The embodiments may be realized by providing a semiconductor device including a substrate; a plurality of active fin units disposed to have a predetermined height on a top surface of the substrate and including at least two active fins spaced an active fin spacing distance from each other; dummy fins disposed on both sides of the active fin units on the top surface of the substrate to have a smaller height than the active fins, and spaced apart from outer sidewalls of the active fins disposed at outermost sides of the active fin units by a spacing distance greater than the active fin spacing distance; and a device isolation film disposed on the substrate to have a height such that upper portions of the active fins are not in contact therewith but the entire dummy fins are in contact therewith.

BRIEF DESCRIPTION OF THE DRAWINGS

Features will be apparent to those of skill in the art by describing in detail exemplary embodiments with reference to the attached drawings in which.

DETAILED DESCRIPTION

First, the method of manufacturing a semiconductor device according to the exemplary embodiments will be described.

Figure 1:
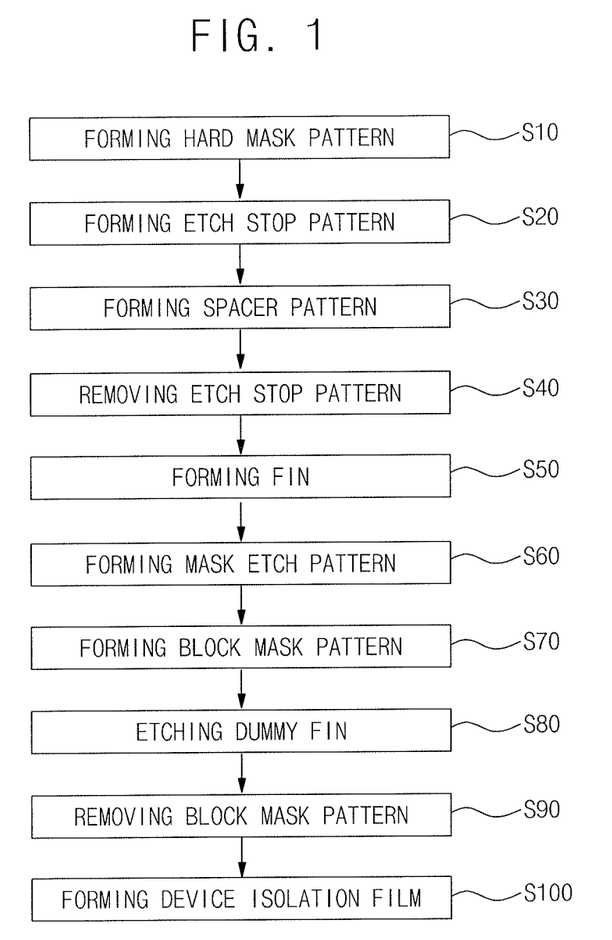
FIG. 1 illustrates a process flowchart of a method of manufacturing a semiconductor device according to an exemplary embodiment.

FIG. 1 illustrates a process flowchart of a method of manufacturing a semiconductor device according to an exemplary embodiment. FIGS. 2A to 2J illustrate cross-sectional views of stages in the method of manufacturing a semiconductor device according to the exemplary embodiment.

Referring to FIGS. 1 and 2A to 2J, the method of manufacturing a semiconductor device according to the exemplary embodiment may include forming hard mask patterns (S10), forming etch stop patterns (S20), forming spacer patterns (S30), removing the etch stop patterns (S40), forming fins (S50), forming mask etch patterns (S60), forming block mask patterns (S70), etching dummy fins (S80), removing the block mask patterns (S90), and forming a device isolation film (S100).

Figure 2A:
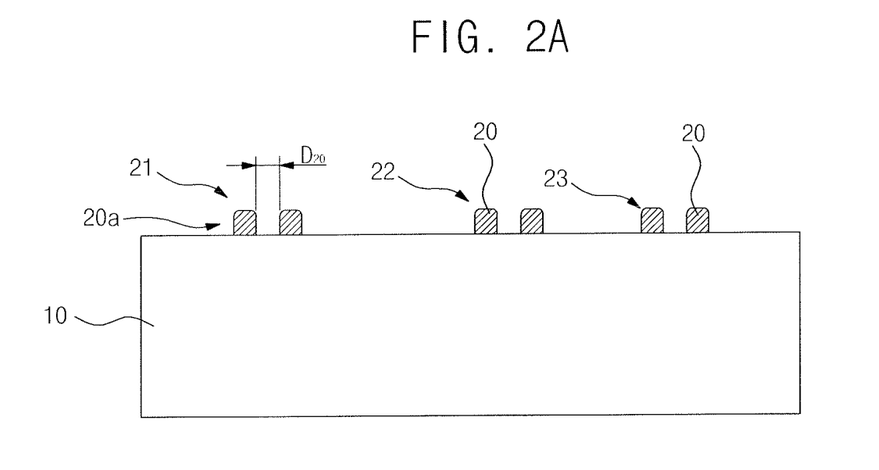
FIGS. 2A to 2J illustrate cross-sectional views of stages in the method of manufacturing a semiconductor device according to the exemplary embodiment.

The method of manufacturing a semiconductor device may include forming a plurality of hard mask units or groups 20a and spacer patterns 40 on a substrate 10. The plurality of hard mask units 20a may each include at least two hard mask patterns 20, which are spaced a pattern spacing distance $D_{20}$ from each other. The spacer patterns 40 may be disposed outside the hard mask units 20a. The substrate 10 may be etched using the hard mask patterns 20 and the spacer patterns 40 as etch masks to form active fins 50 and dummy fins 60. A spacing distance between the active fins 50 and the dummy fins 60 may be greater than a spacing distance between the active fins 50. In the method of manufacturing a semiconductor device, the active fins 50 may be formed to be separated or spaced apart from the dummy fins 60 by the spacing distance, which is greater than the spacing distance between the active fins 50 so that the dummy fins 60 may be precisely etched without etching the active fins 50 during a process of etching the dummy fins 60.

In the method of manufacturing a semiconductor device, the spacer pattern 40 may be formed to have a width that is greater than a width of the hard mask pattern 20 so that a width of the dummy fin 60 may be greater than a width of the active fin 50. In the method of manufacturing a semiconductor device, the dummy fins 60 may lean during the formation of the dummy fins 60 and the active fins 50 so that leaning of the active fins 50 may be reduced.

Referring to FIGS. 1 and 2A, the forming of the hard mask pattern (S10) may include forming the plurality of hard mask units 20a on a surface of the substrate 10. EAch hard mask unit 20a may include at least two hard mask patterns 20 spaced the pattern spacing distance $D_{20}$ from each other. The forming of the hard mask pattern (S10) may include depositing a hard mask layer on the surface of the substrate 10 and anisotropically etching the hard mask layer to form the hard mask pattern 20. The hard mask layer may be anisotropically etched using an additional etch mask. The substrate 10 may be a silicon singe crystalline substrate or a silicon-on-insulator (SOI) substrate.

The semiconductor device may include an active fin unit or group 50a including at least two active fins 50. The active fins 50 of one active fin unit 50a may be disposed to be separated by an active fin spacing distance $D_{50}$ from each other. A plurality of the active fin units 50a may be formed to be separated or spaced apart from each other by a spacing distance that is greater than the active fin spacing distance $D_{50}$. The hard mask patterns 20 may act as etch masks for forming the active fins 50. The number and positions of the hard mask units 20a may be formed corresponding to the number and positions of the active fin units 50a. The number and positions of the hard mask patterns 20 may be formed corresponding to the number and positions of the active fins 50. In an implementation, the active fin spacing distance $D_{50}$ may correspond to the pattern spacing distance $D_{20}$.

In an implementation, some of the hard mask units 20a may include a different number of hard mask patterns 20. The semiconductor device may be formed such that the number and positions of the active fins 50 vary according to a purpose and size of the semiconductor device. Each hard mask unit 20a may include a different number of hard mask patterns 20 according to the number and positions of the active fins 50.

The plurality of hard mask units 20a may be formed to be separated of spaced apart from each other by a spacing distance that is greater than the pattern spacing distance $D_{20}$. In an implementation, the hard mask units 20a may be formed to be separated from each other by different spacing distances. For example, when the hard mask units 20a includes a first hard mask unit 21, a second hard mask unit 22, and a third hard mask unit 23. the first hard mask unit 21, the second hard mask unit 22, and the third hard mask unit 23 may be separated from each other by different spacing distances.

The hard mask pattern 20 may be formed of, e.g., silicon oxide, silicon oxynitride, silicon nitride, a silicon-containing material including tetraethyl orthosilicate (TEOS) or polycrystalline silicon (poly-Si), or a metal.

The hard mask pattern 20 may be formed by patterning a hard mask layer through an etch process using an additional etch mask. The hard mask layer may be formed using an atomic layer deposition (ALD) process, a chemical vapor deposition (CVD) process, or a spin coating process.

Figure 2B:
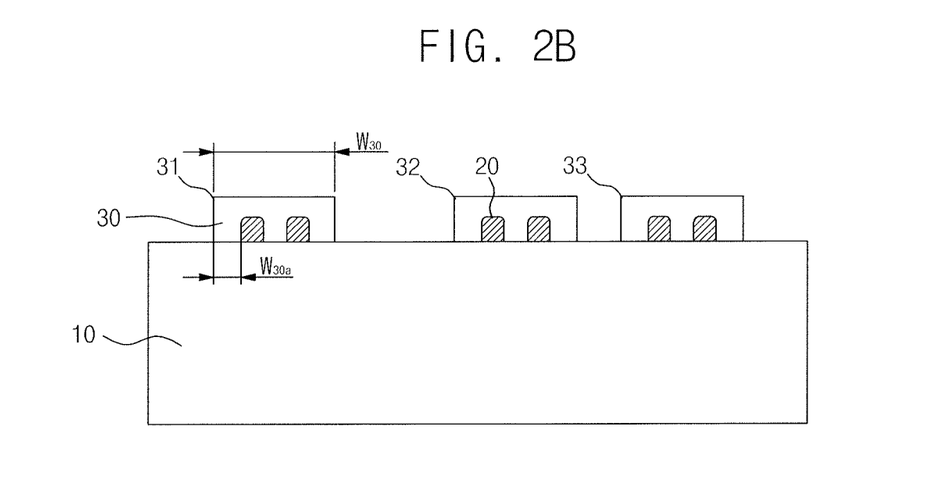

Referring to FIGS. 1 and 2B, the forming of the etch stop pattern (S20) may include forming etch stop patterns 30 surrounding the hard mask units 20a on the top surface of the substrate 10. The number of etch stop patterns 30 identical to the number of the hard mask units 20a may be formed (e.g., each of the hard mask units 20a may have a corresponding etch stop pattern 30 formed thereon). Each of the etch stop patterns 30 may be formed to fully surround the hard mask pattern 20 constituting each of the hard mask units 20a. For example, the etch stop patterns 30 may include a first etch stop pattern 31, a second etch stop pattern 32, and a third etch stop pattern 33. The first etch stop pattern 31 may be formed to surround the first hard mask unit 21, the second etch stop pattern 32 may be formed to surround the second hard mask unit 22, and the third etch stop pattern 33 may be formed to surround the third hard mask unit 23.

Each of the etch stop patterns 30 may be formed to have a stop pattern width $W_{30}$ corresponding to a sum of the widths of the hard mask patterns 20, the pattern spacing distances $D_{20}$, and the stop pattern outer widths $W_{30a}$. Here, the stop pattern outer width $W_{30a}$ may refer to a width from an outer sidewall of the etch stop pattern 30 to an outer sidewall of the hard mask pattern 20 disposed at an outermost side of the hard mask unit 20a. The stop pattern outer width $W_{30a}$ may be greater than the pattern spacing distance $D_{20}$. The stop pattern outer width $W_{30a}$ may be 1.1 times to 3 times the pattern spacing distance $D_{20}$. The stop pattern outer width $W_{30a}$ may correspond to the spacing distance between the active fins 50 and the dummy fin 60. The etch stop pattern 30 may be formed to be separated from neighboring etch stop patterns 30 by a distance corresponding to at least the width of the spacer patterns 40. Accordingly, at least one spacer pattern 40 may be disposed between the etch stop patterns 30.

The forming of the etch stop patterns 30 may include forming an etch stop pattern layer on the top surface of the substrate 10 and patterning the etch stop pattern layer. The etch stop patterns 30 may be formed of a spin-on-hardmask (SOH) or an amorphous carbon layer (ACL).

Figure 2C:
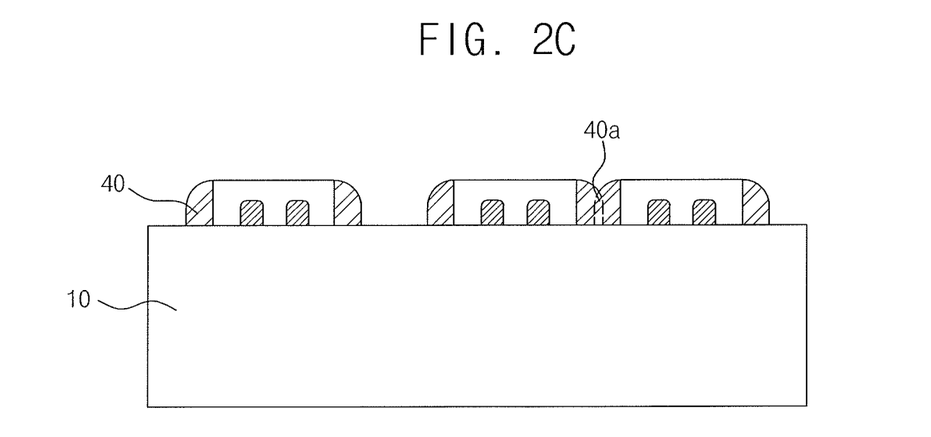

Referring to FIGS. 1 and 2C, the forming of the spacer pattern (S30) may include forming the spacer patterns 40 to cover sidewalls of the etch stop patterns 30. The forming of the spacer patterns 40 may include forming a spacer pattern layer to cover the exposed top surface of the substrate 10 and sidewalls and top surfaces of the etch stop patterns 30 and anisotropically etching the spacer pattern layer.

The spacer pattern layer may be formed of a material having etch selectivity with respect to the substrate 10 and the etch stop pattern 30. For example, when the etch stop patterns 30 are formed of an SOH or ACL, the spacer pattern layer may be formed of silicon oxide or silicon nitride. The spacer pattern layer may be formed using an ALD process. The spacer pattern layer may be anisotropically etched to expose the top surfaces of the etch stop patterns 30. One sidewall of each of the spacer patterns 40 may be in contact with a sidewall of the etch stop pattern 30, and the other sidewall of each of the spacer patterns 40 may be exposed.

The spacer patterns 40 may serve as etch masks for forming the dummy fins 60. Accordingly, the number and positions of the spacer patterns 40 may be formed on the top surface of the substrate 10 to correspond to the number and positions of the dummy fins 60. Each of the spacer patterns 40 may be formed in a planar shape corresponding to a shape of each of the dummy fins 60. The spacer patterns 40 may be formed to have a width corresponding to the width of each of the dummy fins 60.

Each of the spacer patterns 40 may be formed to have a width that is greater than the width of each of the hard mask patterns 20. Each of the spacer patterns 40 may be disposed between sidewalls of adjacent etch stop patterns 30. In an implementation, one spacer pattern 40a may be formed by overlapping at least a portion of each of the spacer patterns 40 disposed between the etch stop patterns 30 in a widthwise direction. For example, when a spacing distance between the etch stop patterns 30 is smaller than the sum of widths of the two spacer patterns 40, the wider spacer pattern 40a may be formed by overlapping the two spacer patterns 40 in the widthwise direction. In this case, a width of the wider spacer pattern 40a may be greater than the width of each of the spacer patterns 40 disposed at different positions.

Figure 2D:
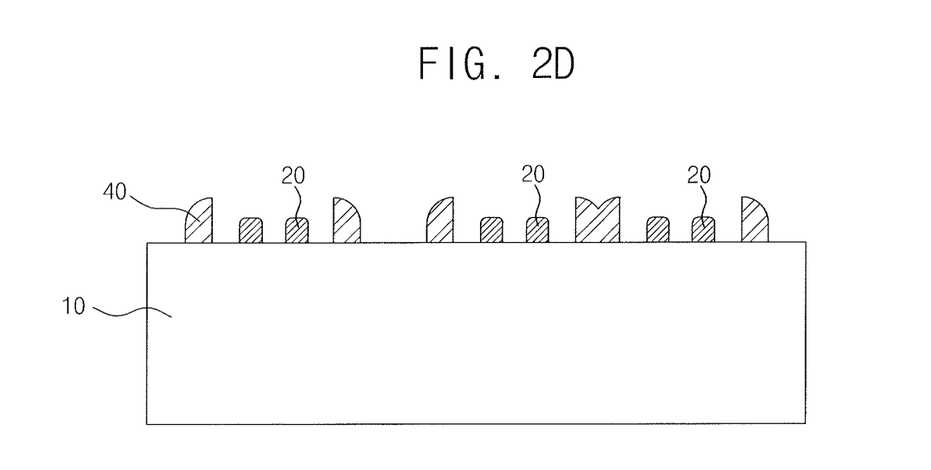
Figure 2E:
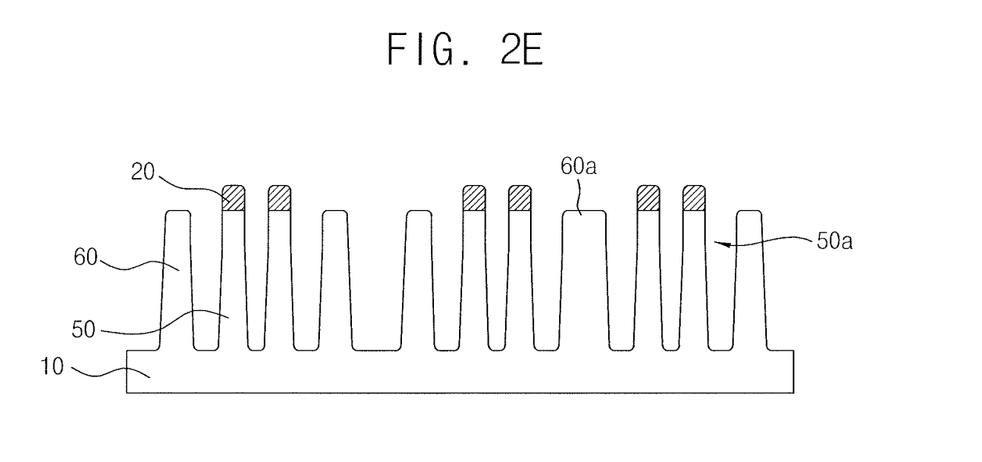

Referring to FIGS. 1 and 2I), the removing of the etch stop pattern (S40) may include selectively removing the etch stop patterns 30. The etch stop patterns 30 may have etch selectivity with respect to the spacer patterns 40, 40a and the hard mask patterns 20. Accordingly, the spacer patterns 40, 40a and the hard mask patterns 20 may not be etched during the removing of the etch stop patterns 30. The etch stop pattern 30 may be removed through an ashing process using oxygen. By removing the etch stop pattern 30, the hard mask patterns 20 may be exposed along with the spacer patterns 40, 40a on the top surface of the substrate 10.

Referring to FIGS. 1 and 2E, the forming of the fin (S50) may include etching the substrate 10 using the hard mask patterns 20 and the spacer patterns 40, 40a as etch masks to form the active fins 50 and the dummy fins 60. Each of the active fins 50 may be formed in a planar shape corresponding to a planar shape of each of the hard mask patterns 20. The active fins 50 may be formed at positions at which (e.g., underlying) the hard mask patterns 20 are formed. The active fins 50 may be arranged to form the plurality of active fin units 50a. Each active fin unit 50a may include at least two active fins 50. In an implementation, some of the active fin units 50a may include a different number of active fins 50. The active fins 50 of one active fin unit 50a may be disposed to be separated from each other by the active fin spacing distance $D_{50}$. The active fin spacing distance $D_{50}$ may correspond to the pattern spacing distance $D_{20}$. The active fin units 50a may be disposed to be separated from each other by a spacing distance that is greater than the active fin spacing distance $D_{50}$. Each of the dummy fins 60 may be formed in a planar shape corresponding to a planar shape of each of the spacer patterns 40. The dummy fins 60 may be formed at positions at which the spacer patterns 40, 40a are formed (e.g., underlying the spacer patterns 40, 40a. Each of the dummy fins 60 may be formed to have a width that is greater than the width of each of the active fins 50. The spacer patterns 40, 40a may be formed to have a greater width than the hard mask patterns 20, and the dummy fins 60 may be formed to have a greater width than the active fins 50.

The dummy fins 60 may be disposed on both sides of the active fin unit 50a. One dummy fin 60 may be formed on each of both sides of the active fin unit 50a. At least two dummy fins 60 may be formed on each of both sides of the active fin unit 50a. The dummy fins 60 may be spaced apart from the active fin 50 disposed at an outermost side of the active fin unit 50a by a constant spacing distance. The dummy fins 60 may be spaced apart from the active fin 50 disposed at the outermost side of the active fin unit 50a by a spacing distance $D_{60}$ that is is greater than the active fin spacing distance $D_{50}$. The spacing distance $D_{60}$ between the dummy fins 60 and an outer sidewall of the active fin 50 disposed at the outermost side may be 1.1 times to 3 times the active fin spacing distance $D_{50}$.

If the dummy fins 60 were to be omitted, the active fins 50 disposed at outer sides of the active fin units 50a could be placed in different environments according to a spacing distance between neighboring active fin units 50a. For example, the active fin 50 could be spaced apart from the neighboring active fins 50 by different spacing distances. Active fins 50 that are spaced apart from each other by a great spacing distance could undesirably be formed to have further inclined sidewalls due to differences in etching environments. By forming the dummy fins 60, the active fins 50 disposed at the outermost side of the active fin unit 50a may have the same etching environments as or similar etching environments to the active fins 50 disposed at an inner side of the active fin unit 50a. Accordingly, the active fins 50 disposed at the outer side of the active fin unit 50a may be etched in the same shape as or a similar shape to the active fins 50 at the inner side of the active fin unit 50a.

Figure 2F:
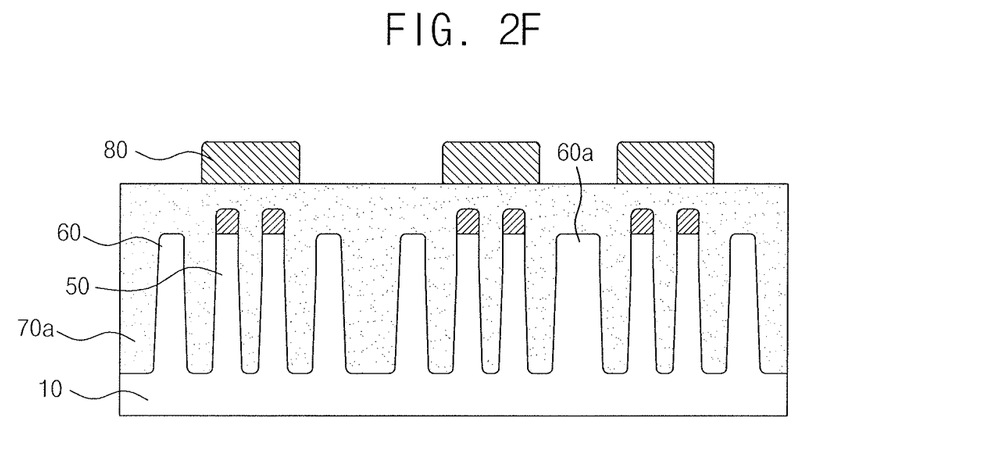

Referring to FIGS. 1 and 2F, the forming of the mask etch pattern (S60) may include forming a block mask pattern layer 70a to surround the active fins 50 and the dummy fins 60 and forming mask etch patterns 80 in regions of a top surface of the block mask pattern layer 70a that include or overlie upper portions of the active fins 50.

The block mask pattern layer 70a may be formed on the top surface of the substrate 10 to surround top surfaces and side surfaces of the active fins 50 and the dummy fins 60. The block mask pattern layer 70a may be formed in regions including the top surfaces of the active fins 50 and the dummy fins 60, trenches between the active fins 50, and spacing regions between the active fins 50 and the dummy fins 60. In an implementation, the block mask pattern layer 70a may include a layer including amorphous carbon and an organic planarization layer. A mask layer formed of a silicon oxynitride layer, a silicon oxide layer, or a silicon nitride layer may be further formed on the top surface of the block mask pattern layer 70a.

The mask etch patterns 80 may be formed in or on regions including or overlying the upper portions of the active fins 50 on the top surface of the block mask pattern layer 70a. In an implementation, the mask etch patterns 80 may be formed in or on regions including or overlying regions between upper regions of the active fins 50 and the active fins 50 and portions of regions between the active fins 50 and the dummy fins 60. The forming of the mask etch patterns 80 may include forming a mask etch pattern layer and etching the mask etch pattern layer using an additional etch mask. The mask etch patterns 80 may be formed using a photoresist layer.

Figure 2G:
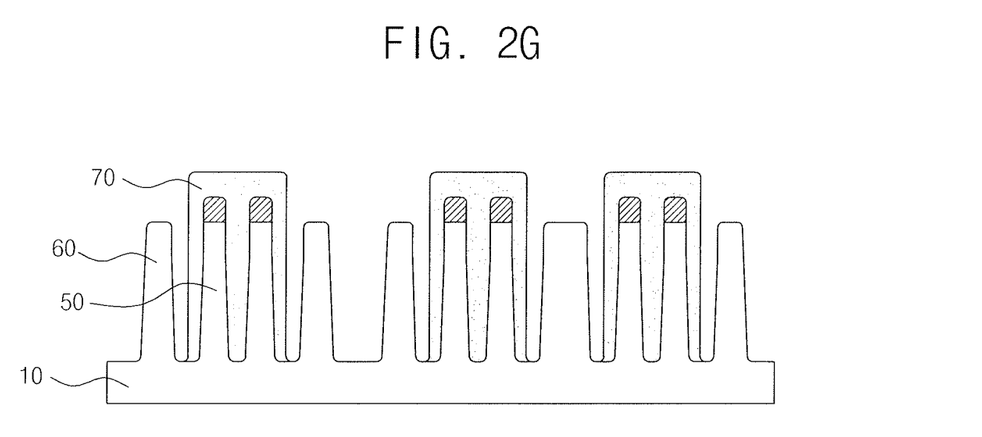

Referring to FIGS. 1 and 2G, the forming of the block mask pattern (S70) may include etching the block mask pattern layer 70a to form block mask patterns 70 surrounding the active fins 50.

The block mask pattern layer 70a may be etched using the mask etch pattern 80 (formed on the top surface of the block mask pattern layer 70a) as an etch mask. The block mask pattern layer 70a may be etched using a selective etching process. The block mask patterns 70 may be implemented as patterns covering the active fins 50 that are disposed between the dummy fins 60. The block mask patterns 70 may be implemented as patterns corresponding to the active fin units 50a to surround all of the active fins 50 constituting the active fin units 50a. The block mask patterns 70 may be formed to surround all of the top surfaces and side surfaces of the active fins 50. Sidewalls of the block mask patterns 70 may be disposed between the active fins 50 and the dummy fins 60.

Figure 2H:
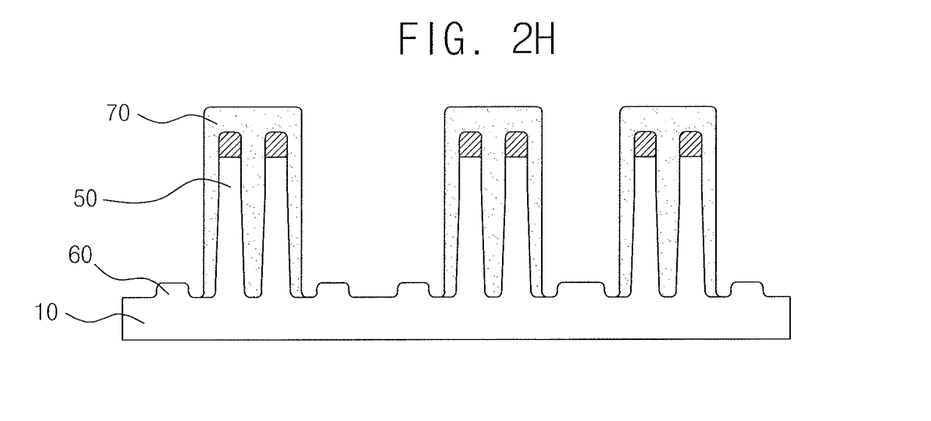

Referring to FIGS. 1 and 2H, the etching of the dummy fin (S80) may include etching the dummy fins 60 using the block mask patterns 70 as etch masks. The block mask patterns 70 may be formed to surround the active fins 50 and expose the dummy fins 60. The block mask patterns 70 may not be in contact with the top surfaces and both side surfaces of the dummy fins 60 (e.g., may not contact any surface of the dummy fins 60). Accordingly, the etching of the dummy fin (S80) may include etching the exposed dummy fins 60 without etching the active fins 50. The dummy fins 60 may be etched and maintained having a predetermined height from the top surface of the substrate 10. Accordingly, trenches having a depth corresponding to the height of the dummy fins 60 may be formed between the active fins 50 and the dummy fins 60 in the top surface of the substrate 10. The spacing distance $D_{60}$ between the dummy fins 60 and the active fins 50 may be greater than the active fin spacing distance $D_{50}$.

Figure 2I:
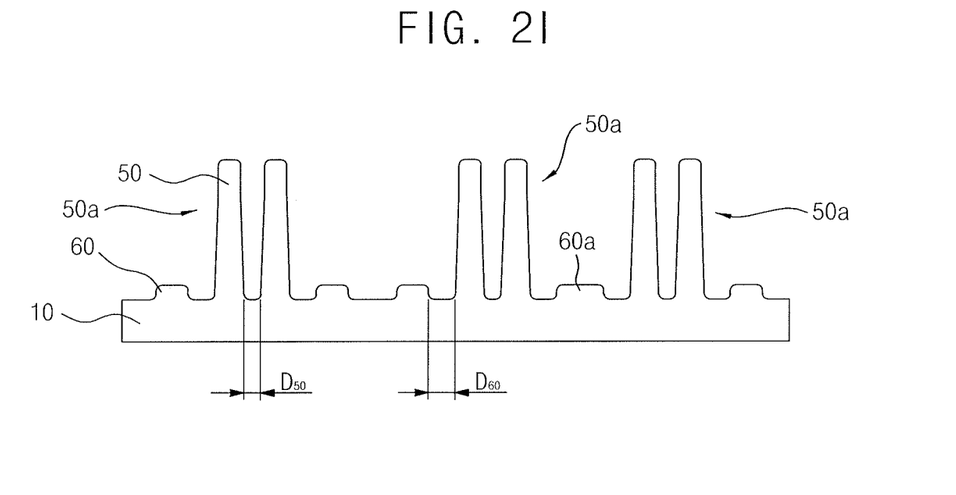

Referring to FIGS. 1 and 2I, the removing of the block mask pattern (S90) may include removing the block mask patterns 70 surrounding the active fins 50. The block mask patterns 70 may be removed using a selective etching process. After the block mask patterns 70 are removed, the active fins 50 may be fully exposed on the top surface of the substrate 10. In an implementation, any remaining portion of the hard mask patterns 20 on the active fins 50 may also be removed during the removing of the block mask pattern.

Figure 2J:
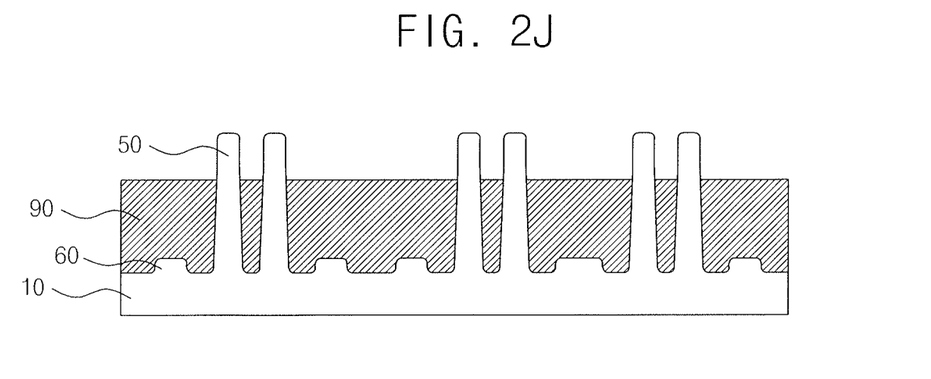

Referring to FIGS. 1 and 2J, the forming of the device isolation film (S100) may include forming a device isolation film 90 to have a predetermined height on the substrate 10 to expose the upper portions of the active fins 50. The device isolation film 90 may be formed to have a smaller height than the active fins 50. The device isolation film 90 may be formed to have a greater height than the dummy fins 60. The device isolation film 90 may expose the active fins 50 and may not expose (e.g., any remaining portions of) the dummy fins 60. The device isolation film 90 may not be in contact with the top surfaces and all of both side surfaces of the active fins 50, but may be in contact with the top surfaces and both side surfaces of (e.g., any remaining portions of) the dummy fins 60. The device isolation film 90 may fill in regions between the active fins 50. The device isolation film 90 may electrically insulate the active fins 50 from each other. The device isolation film 90 may be formed using a high-density plasma (HDP) oxide film, a spin-on glass (SOG) film, or a CVD oxide film.

Next, a semiconductor device manufactured using the method of manufacturing a semiconductor device according to an exemplary embodiment will be described.

Figure 3:
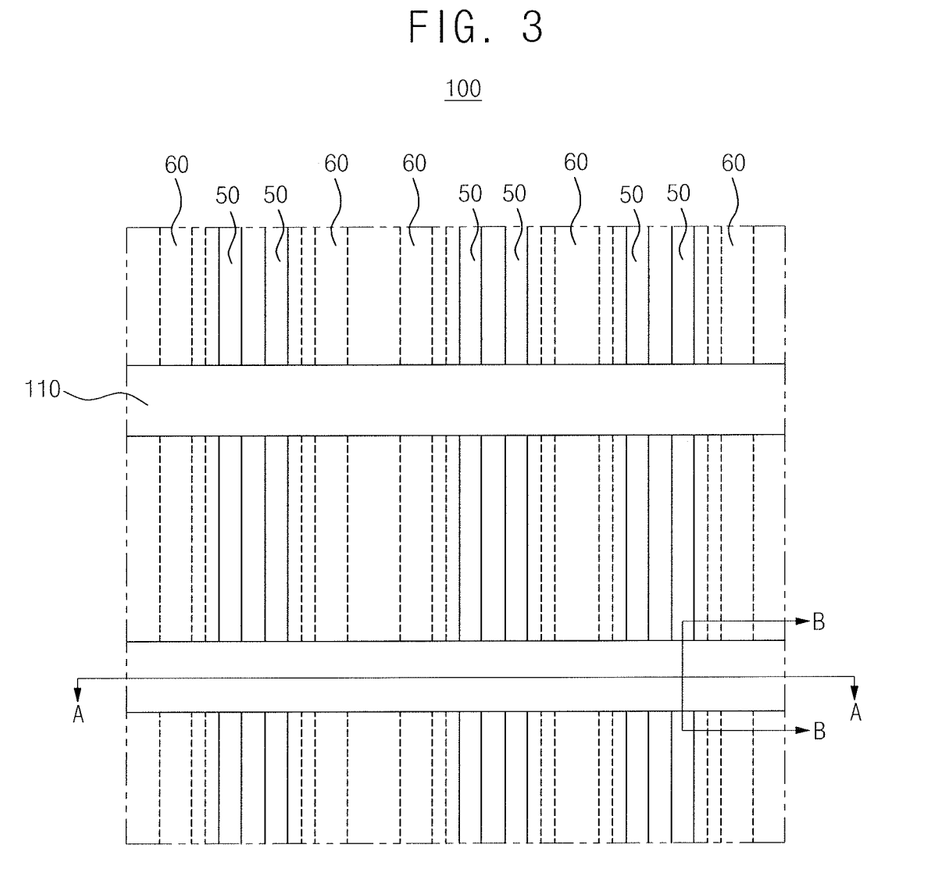
FIG. 3 illustrates a plan view of a semiconductor device according to an exemplary embodiment.
Figure 4:
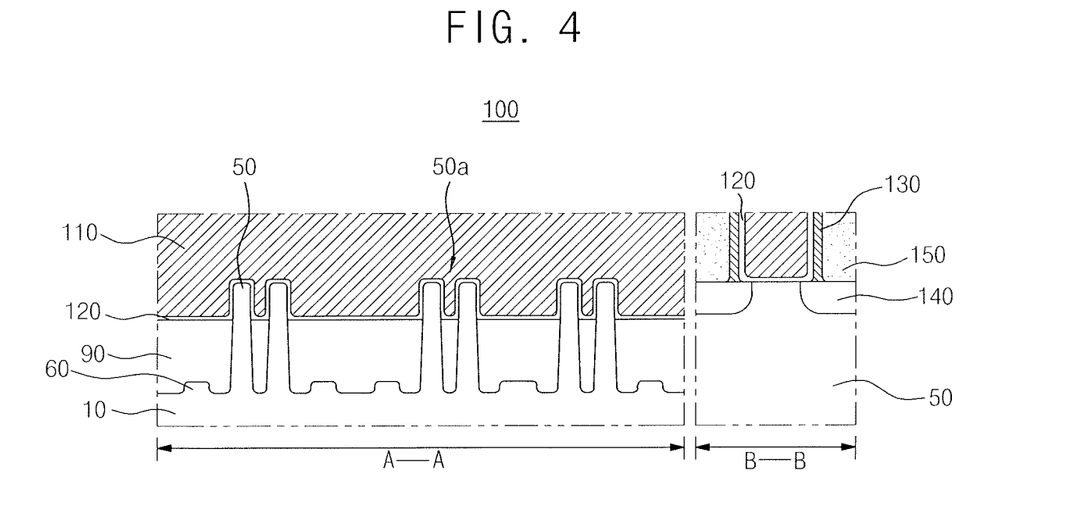
FIG. 4 illustrates a cross-sectional view taken along line A-A and B-B of FIG. 3.

FIG. 3 illustrates a plan view of a semiconductor device according to an exemplary embodiment. FIG. 4 illustrates a cross-sectional view taken along line A-A and B-B of FIG. 3.

Referring to FIGS. 3 and 4, a semiconductor device 100 according to an embodiment may include a substrate 10, active fins 50, dummy fins 60, and a device isolation film 90. The semiconductor device 100 may further include a gate electrode 110, a gate insulating film 120, gate spacers 130, and source and drain regions 140. The semiconductor device may further include an interlayer insulating layer 150. The interlayer insulating layer 150 is illustrated in FIG. 4.

The substrate 10 may be a suitable semiconductor substrate such as a silicon wafer. The substrate 10 may be an SOI substrate.

The active fins 50 may be formed to have a predetermined height on a top surface of the substrate 10, and may include at least two active fins 50 that are spaced an active fin spacing distance $D_{50}$ from each other. A plurality of active fin units 50a (see FIG. 2I) may be formed, and each of the active fin units 50a may include at least two active fins 50. In an implementation, the number of active fins 50 that constitute each of the active fin units 50a may be variously determined in consideration of a purpose, a size, and a threshold voltage of the semiconductor device. In an implementation, the active fin units 50a may include different numbers of active fins 50 according to a structure of the semiconductor device. For example, one active fin unit 50a may include two active fins 50, another active fin unit 50a may include three active fins 50, and yet another active fin unit 50a may include four active fins 50. The active fin units 50a may be disposed to be separated from each other by different distances. For example, the active fin unit 50a may be spaced apart from an active fin unit 50a disposed on one side thereof and an active fin unit 50a disposed on the other side by different distances.

The active fins 50 of one active fin unit 50a may be disposed to be separated by the active fin spacing distance $D_{50}$ from each other. The active fin spacing distance $D_{50}$ may refer to a distance that separates neighboring active fins 50 in one active fin unit 50a. The active fin spacing distance $D_{50}$ may be a distance corresponding to the above-described pattern spacing distance $D_{20}$ which is a distance between hard mask patterns 20. The active fin spacing distances $D_{50}$ may be the same or different in one active fin unit 50a. The active fin spacing distances $D_{50}$ may be different in each of the active fin units 50a. In an implementation, a spacing distance between active fins 50 disposed at outermost sides of neighboring active fin units 50a may vary according to a spacing distance between the active fin units 50a.

The dummy fins 60 may be formed to have a predetermined height on the top surface of the substrate 10 and have a lower height than the active fins 50. The dummy fins 60 may be disposed on both sides of the active fin unit 50a and spaced apart from an outer sidewall of the active fin 50 disposed at the outermost side of the active fin unit 50a by a spacing distance $D_{60}$ which is greater than the active fin spacing distance $D_{50}$. Here, the spacing distance may be a spacing distance measured at the same height from the top surface of the substrate 10. At least one dummy fin 60 may be formed on each of both sides of the active fin unit 50a. The dummy fins 60 may reduce the occurrence of loading or leaning of the active fins 50 during a process of forming the active fins 50.

The spacing distance $D_{60}$ between the dummy fin 60 and the active fin 50 may be, e.g., 1.1 times to 3 times the active fin spacing distance $D_{50}$. Maintaining a spacing distance between the dummy fin 60 and the active fin 50 at 1.1 times the active fin spacing distance $D_{50}$ or greater may help ensure that the active fin 50 is sufficiently protected and is not etched during a process of etching the dummy fin 60. Maintaining a spacing distance between the dummy fin 60 and the active fin 50 at 3 times the active fin spacing distance $D_{50}$ or less may help ensure that integration density of semiconductor devices is not reduced.

The dummy fins 60 may be formed to have a greater width than the active fins 50. Here, the width of the dummy fins 60 and the width of the active fins 50 may be widths measured at the same height from the top surface of the substrate 10. At least one of the dummy fins 60 may be formed to have a different width from the remaining dummy fins. The dummy fin 60 may be formed between neighboring active fin units 50*a*, when a distance between the active fin units 50*a* is small, and the dummy fins 60 may be formed to be in contact with or overlap each other. In this case, a dummy fin 60*a* may be formed to have a greater width than other dummy fins 60.

The device isolation film 90 may be deposited to have a predetermined height on the top surface of the substrate 10. The device isolation film 90 may be formed to have a greater height than the dummy fins 60 and a smaller height than the active fins 50. The device isolation film 90 may be formed to have a height such that upper portions of the active fins 50 are exposed and the dummy fins 60 are not exposed. The device isolation film 90 may be formed on the substrate 10 to have a height such that the upper (e.g., exposed) portions of the active fins 50 are not in contact therewith but the entire dummy fins 60 are in contact therewith. The device isolation film 90 may be formed to fill spaces between the active fins 50, surround the sidewalls of the active fins 50, and expose the upper portions of the active fins 50. The device isolation film 90 may be formed to surround the sidewalls and top surfaces of the dummy fins 60. Accordingly, the active fins 50 may protrude to have a predetermined height from a top surface of the device isolation film 90, while the dummy fins 60 may not protrude from the top surface of the device isolation film 90. The device isolation film 90 may be formed of an HDP oxide film, a SOG film, or a CVD oxide film.

The gate electrode 110 may be formed to surround the active fins 50 protruding upwardly from the device isolation film 90 and run across the active fins 50. The gate electrode 110 may be formed to surround the top surfaces and both side surfaces of the active fins 50. The gate electrode 110 may be formed to surround three surfaces of each of the active fins 50. The gate electrode 110 may extend in a direction perpendicular to a direction in which the active fins 50 extend, and may intersect the active fins 50. In an implementation, the gate electrode 110 may be formed of, e.g., a metal such as aluminum (Al), tungsten (W), or molybdenum (Mo). In an implementation, the gate electrode 110 may be formed of, e.g., a conductive metal nitride such as titanium nitride (TiN) or tantalum nitride (TaN). The gate electrode 110 may be formed using an ALD process or a CVD process.

The gate insulating film 120 may be formed between the gate electrode 110 and the active fins 50. The gate insulating film 120 may electrically insulate the gate electrode 110 from the active fins 50. The gate insulating film 120 may also be formed between the gate electrode 110 and the device isolation film 90. The gate insulating film 120 may also be formed on sidewalls of the gate electrode 110. The gate insulating film 120 may be formed of a high-k dielectric film having a higher dielectric constant than a silicon oxide film. In an implementation, the gate insulating film 120 may be formed of, e.g., a tantalum oxide film, a titanium oxide film, a hafnium oxide film, a zirconium oxide film, an aluminum oxide film, or an yttrium oxide film. The gate insulating film 120 may be formed using an ALD process or a CVD process.

The gate spacers 130 may be formed to surround both sidewalls of the gate electrode 110. When the gate insulating film 120 is formed on both of the sidewalls of the gate electrode 110, the gate spacers 130 may be formed to surround both sidewalls of the gate insulating film 120. In an implementation, the gate spacer 130 may be formed of, e.g., a material such as silicon oxide, silicon nitride, silicon oxynitride, and silicon carbonitride.

The formation of the source and drain regions 140 may include implanting impurity ions into the active fins 50 exposed on both sides of the gate electrode 110 in regions at which the active fins 50 intersect the gate electrode 110. In an implementation, the source and drain regions 140 may be connected to source and drain contacts.

Meanwhile, the interlayer insulating layer 150 may be formed to fill spaces between the top surfaces of the active fins 50 and the top surface of the device isolation film 90 and sidewalls of the gate spacers 130. The interlayer insulating layer 150 may be formed using a physical vapor deposition (PVD) process, a CVD process, an ALD process, or a spin coating process. In an implementation, the interlayer insulating layer 150 may be formed of, e.g., a material such as silicon nitride, silicon oxide, or silicon oxynitride.

In the semiconductor device according to an embodiment, all of the active fins 50 of the active fin units 50*a* formed to be separated from each other by different spacing distances may be formed in a uniform shape, and characteristics thereof, such as a threshold voltage, may be uniform. In the semiconductor device according to an embodiment, damage to the active fins 50 disposed at the outermost side of the active fin unit 50*a* may be reduced during an etching process, and the active fins 50 disposed at the outermost side of the active fin unit 50*a* and active fins 50 disposed at an inner side of the active fin unit 50*a* may have constant characteristics.

According to the exemplary embodiments, active fins may be spaced apart from dummy fins by a distance which is greater than a distance between the active fins to facilitate the etching of the dummy fins and reduce damage to the active fins. Thus, reliability of semiconductor devices may be improved.

According to the exemplary embodiments, dummy fins having a greater thickness than active fins may be formed on both sides of the active fins. Thus, loading and leaning phenomena can be reduced during a process of etching the active fins, thereby improving reliability of semiconductor devices.

By way of summation and review, due to the increase in integration density of semiconductor devices, fine patterns having a linewidth smaller than a resolution limit of a photolithography process may be implemented. With the increase in integration density, semiconductor devices may be formed in fine patterns and improve reliability. Such semiconductor devices may require process techniques capable of obtaining reliable product characteristics.

The embodiments may provide a method of manufacturing a semiconductor device capable of improving reliability of a semiconductor device, and a semiconductor device manufactured using the method.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly. it will be understood by those of skill in the art that various changes in form and details may be made without departing from the spirit and scope of the present invention as set forth in the following claims.

What is claimed is:

1. A method of manufacturing a semiconductor device, the method comprising:
   forming hard mask patterns on a substrate such that forming the hard mask pattern includes forming a plurality of hard mask units, each hard mask unit having at least two hard mask patterns that are spaced a pattern spacing distance from each other and the hard mask units being separated from each other by a spacing distance that is greater than the pattern spacing distance;
   forming etch stop patterns surrounding the hard mask patterns of the hard mask units;
   forming spacer patterns covering sidewalls of the etch stop patterns;
   removing the etch stop patterns;
   etching the substrate using the hard mask patterns and the spacer pattern as etch masks to form at least one active fin unit that includes at least two active fins and to form dummy fins disposed on both sides of the at least one active fin unit;
   forming a block mask pattern layer surrounding the active fins and the dummy fins and forming mask etch patterns in regions including upper portions of the active fins on a top surface of the block mask pattern layer;
   etching the block mask pattern layer using the mask etch patterns to form block mask patterns surrounding the active fins;
   etching the dummy fins using the block mask patterns;
   removing the block mask patterns surrounding the active fins; and
   depositing a device isolation film on the substrate such that the device isolation film is not in contact with the upper portions of the active fins,
   wherein a spacing distance between one active fin and an adjacent dummy fin is greater than an active fin spacing distance between adjacent active fins.

2. The method as claimed in claim 1, wherein a width from a sidewall of each of the etch stop patterns to an outer sidewall of the hard mask pattern disposed at an outermost side of the hard mask unit is greater than the pattern spacing distance.

3. The method as claimed in claim 1, wherein the spacing distance between the active fin and the dummy fin is 1.1 times to 3 times the active fin spacing distance.

4. The method as claimed in claim 1, wherein each etch stop pattern is separated from a neighboring etch stop pattern by a distance corresponding to at least a width of the spacer pattern.

5. The method as claimed in claim 1, wherein the spacer pattern is formed by overlapping at least a portion of a neighboring spacer pattern.

6. The method as claimed in claim 1, wherein a width of the spacer pattern is greater than a width of the hard mask pattern.

7. The method as claimed in claim 1, wherein a width of the dummy fin is greater than a width of the active fin.

8. The method as claimed in claim 1, wherein the dummy fins are etched and maintained to have a smaller height than a top surface of the device isolation film.

9. The method as claimed in claim 1, wherein:
   the at least one active fin unit includes a plurality of active fin units, and
   one of the active fin units includes a different number of active fins from another active fin unit.

10. The method as claimed in claim 1, wherein the device isolation film is formed to not be in contact with top surfaces and upper portion of both side surfaces of the active fins.

11. A method of manufacturing a semiconductor device, the method comprising:
    forming a plurality of hard mask units on a substrate such that each of the hard mask units includes at least two hard mask patterns spaced a pattern spacing distance from each other on an upper portion of the substrate;
    forming a plurality of spacer patterns on the substrate such that the spacer patterns are outside the hard mask units; and
    forming active fins and dummy fins by etching the substrate using the hard mask patterns and the spacer patterns as etch masks,
    wherein:
    a spacing distance between one active fin and an adjacent dummy fin is greater than a spacing distance between adjacent active fins, and
    a width of each dummy fin is greater than a width of each active fin.

12. The method as claimed in claim 11, wherein a width of the spacer patterns is greater than a width of the hard mask patterns.

13. The method as claimed in claim 11, wherein the spacer patterns are formed by overlapping at least a portion of a neighboring spacer pattern.

14. A semiconductor device prepared according to the method as claimed in claim 1.

15. The semiconductor device as claimed in claim 14, wherein the spacing distance between the active fin and the dummy fin is 1.1 times to 3 times the active fin spacing distance.

16. The semiconductor device as claimed in claim 14, wherein a width of the dummy fin is greater than a width of the active fin.

17. The semiconductor device as claimed in claim 14, wherein at least one of the dummy fins has a different width from the remaining dummy fins.

18. The semiconductor device as claimed in claim 14, wherein the device isolation film is not in contact with top surfaces of the active fins.

19. The semiconductor device as claimed in claim 14, further comprising:
    a gate electrode surrounding top surfaces and part of both side surfaces of the active fins that protrude upwardly from the device isolation film, and the gate electrode crossing the active fins;
    a gate insulating film between the gate electrode and the active fins; and
    a source and drain region in the active fins exposed on both sides of the gate electrode in regions at which the active fins intersect the gate electrode.

* * * * *